(12) United States Patent
Tsukamoto et al.

(10) Patent No.: US 9,068,258 B2
(45) Date of Patent: Jun. 30, 2015

(54) TITANIUM TARGET FOR SPUTTERING

(75) Inventors: Shiro Tsukamoto, Ibaraki (JP);
Nobuhito Makino, Ibaraki (JP);
Hideaki Fukuyo, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 192 days.

(21) Appl. No.: 13/824,412

(22) PCT Filed: Oct. 24, 2011

(86) PCT No.: PCT/JP2011/074394
§ 371 (c)(1),
(2), (4) Date: Mar. 18, 2013

(87) PCT Pub. No.: WO2012/057057
PCT Pub. Date: May 3, 2012

(65) Prior Publication Data
US 2013/0186753 A1    Jul. 25, 2013

(30) Foreign Application Priority Data

Oct. 25, 2010  (JP) .................................. 2010-238586

(51) Int. Cl.
*H01B 1/02* (2006.01)
*C23C 14/34* (2006.01)
*C22C 14/00* (2006.01)
*C22F 1/18* (2006.01)
*C22C 1/02* (2006.01)

(52) U.S. Cl.
CPC .............. *C23C 14/3407* (2013.01); *C22C 14/00* (2013.01); *C23C 14/3414* (2013.01); *C22F 1/183* (2013.01); *C22C 1/02* (2013.01)

(58) Field of Classification Search
CPC .................................................... C23C 14/3414
USPC .......................... 252/519.12, 520.2; 148/421; 204/298.13
See application file for complete search history.

(56) References Cited

U.S. PATENT DOCUMENTS 5,772,860 A   6/1998   Sawada et al.
5,798,005 A   8/1998   Murata et al.
6,210,502 B1  4/2001   Takahashi
(Continued)

FOREIGN PATENT DOCUMENTS

JP   H08-333676 A   12/1996
JP   09-104972 A    4/1997
(Continued)

OTHER PUBLICATIONS

T. Ishigami et al, "High Purity Ti Sputter Target for VLSIs", Toshiba Review, Toshiba Corporation, Tokyo, JP, No. 161, pp. 38-41, Jan. 1987.

*Primary Examiner* — Khanh Tuan Nguyen
(74) *Attorney, Agent, or Firm* — Howson & Howson LLP

(57) ABSTRACT

Provided is a titanium target for sputtering having a Shore hardness Hs of 20 or more and a basal plane orientation ratio of 70% or less. In the titanium target for sputtering, the purity of titanium is 99.995 mass % or more, excluding gas components. It is an object of the present invention to provide a high-quality titanium target for sputtering, in which impurities are reduced, and which can prevent occurrence of cracking or breaking in high-power sputtering (high-rate sputtering), stabilize sputtering characteristics, and effectively suppress occurrence of particles during formation of a film.

13 Claims, 2 Drawing Sheets

Microstructure

(56) References Cited

U.S. PATENT DOCUMENTS

| | | |
|---|---|---|
| 6,302,977 B1 | 10/2001 | Liu |
| 6,531,091 B2 | 3/2003 | Miyamoto et al. |
| 6,755,948 B1 | 6/2004 | Fukuyo et al. |
| 8,663,440 B2 | 3/2014 | Tsukamoto et al. |
| 2009/0068449 A1 | 3/2009 | Hu et al. |
| 2012/0073964 A1 | 3/2012 | Tsukamoto et al. |
| 2013/0001069 A1 | 1/2013 | Nakashima et al. |
| 2014/0027277 A1 | 1/2014 | Makino et al. |
| 2014/0251802 A1 | 9/2014 | Tsukamoto et al. |

FOREIGN PATENT DOCUMENTS

| | | | | |
|---|---|---|---|---|
| JP | 09-143704 A | 6/1997 | | |
| JP | 09-268368 A | 10/1997 | | |
| JP | 11-269621 | * 10/1999 | | C22F 1/18 |
| JP | 2010-235998 A | 10/2010 | | |

* cited by examiner

Microstructure

TITANIUM TARGET FOR SPUTTERING

BACKGROUND

The present invention relates to a high-quality titanium target for sputtering, in which impurities content is reduced, and which can prevent occurrence of cracking and breaking even in high-power sputtering (high-rate sputtering), stabilize sputtering characteristics, and effectively suppress occurrence of particles in formation of a film. Note that throughout the description, impurity concentrations are all expressed by mass %.

In recent years, various electronic instruments have been developed originated from a significant progress of semiconductors, and improvements in performance of the instruments and development of novel instruments are being performed daily and hourly.

In such a circumstance, there is a tendency that electronic and device instruments are further reduced in size and are increased in degree of integration. A large number of thin films are formed in various steps of producing these instruments, and titanium is also utilized due to the specific metallic properties thereof in formation of thin films of many electronic instruments as, for example, titanium films or its alloy films, titanium silicide films, or titanium nitride films.

In the case of forming such thin films of titanium (including alloys and compounds of titanium), it should be paid attention that titanium itself is required to have a significantly high purity.

Thin films used in, for example, semiconductors tend to be further reduced in thickness and size, the distances between each film are extremely short, and the integration density is increasing. This causes a problem that the material constituting a thin film or impurities contained in the thin film diffuse to the adjacent thin film. Accordingly, the constitutive material balance between a thin film and its adjacent film is collapsed to cause a severe problem to decrease the function that should be essentially possessed by the film.

In the process of producing such a thin film, the film is heated to several hundred degrees (Celsius) in some cases, and the temperature also rises during the use of an electronic instrument in which a semiconductor device is integrated. Such a rise in temperature further increases the diffusion rate of the aforementioned material to cause a severe problem of functional depression in the electronic instrument by the diffusion. In general, for example, films of titanium, its alloy, titanium silicide, or titanium nitride can be formed by physical vapor deposition such as sputtering or vacuum vapor deposition. Sputtering, which is most widely used among these methods, will be described below.

The sputtering is a method of allowing positive ions such as $Ar^+$ to physically collide with a target disposed on the cathode to release metal atoms constituting the target by the collision energy. A nitride can be formed by sputtering using titanium or its alloy (e.g., a TiAl alloy) as a target in an atmosphere of a gas mixture of argon gas and nitrogen.

In formation of this sputtering film, if the titanium (including alloys and compounds) target contains impurities, coarse grains floating in a sputtering chamber adhere onto a substrate to cause disconnection or short-circuit of a thin film circuit, and the occurrence of particles, which may cause to form protrusions on the film, increases so that a problem occurs that uniform films cannot be formed.

Because of this, it is obviously necessary to reduce the amounts of transition metals, high melting metals, alkali metals, alkali earth metals, and other metals, which are conventionally recognized as impurities. Unfortunately, even if these elements are reduced as much as possible, the aforementioned particles occur. Thus, no fundamental solution has been found yet.

In addition, though a titanium thin film may be used as a pasting layer for preventing occurrence of particles when forming a titanium nitride (Ti—N) film, the titanium thin film is hard and cannot have a sufficient strength of adhesion, resulting in peeling off the inner wall or a component of a film formation apparatus. Thus, the titanium thin film does not achieve the function as a pasting layer and causes occurrence of particles.

Furthermore, recently, there is a demand for high-rate sputtering (high-power sputtering) in order to increase the production efficiency. In such sputtering, cracking or breaking of the target tends to occur, and it causes a problem of preventing stable sputtering. Patent Documents 1 and 2 are cited as prior art documents.

Patent Document 3 describes a titanium target for sputtering showing an X-ray diffraction intensity ratio of $(0002)/(10-11) \geq 0.8$ and $(0002)/(10-10) \geq 6$ on the sputtered surface and having a recrystallized structure with an average crystal grain size of 20 μm or less, and proposes a titanium target, with which a film can be easily formed in a narrow and deep contact hole and occurrence of particles can be reduced.

Patent Document 4 describes a titanium target for sputtering having a Vickers hardness in the range of $110 \leq HV \leq 130$ and a recrystallized structure, and proposes a titanium target, with which sputtered grains are arranged in the same direction, a film can be easily formed in a narrow and deep contact hole, and occurrence of particles can be reduced.

Patent Document 5 describes a titanium target for sputtering where a titanium target material having a recrystallized structure with a maximum grain size of 20 μm or less and an average crystal grain size of 10 μm or less is diffusion-bonded to a backing plate primarily made of aluminum, and proposes a titanium target, with which sputtered grains are arranged in the same direction, a film can be easily formed in a narrow and deep contact hole, and occurrence of particles can be reduced.

In the inventions proposed in the aforementioned documents, however, cracking or breaking readily occurs during high-power sputtering, and it is thought that the problems described in each document are not sufficiently solved.

Patent Document 1: International Publication No. WO 01/038598
Patent Document 2: Published Japanese Translation No. 2001-509548 of PCT Application
Patent Document 3: Japanese Laid-Open Patent Publication No. H8-269701
Patent Document 4: Japanese Laid-Open Patent Publication No. H9-104972
Patent Document 5: Japanese Laid-Open Patent Publication No. H9-143704

SUMMARY OF INVENTION

Technical Problem

It is an object of the present invention to solve the above-described problems and to provide a high-quality titanium target for sputtering, in which impurities causing occurrence of particles and an abnormal discharge phenomenon are reduced, and which can prevent occurrence of cracking or breaking even in high-power sputtering (high-rate sputtering), stabilize sputtering characteristics, and effectively suppress occurrence of particles during formation of a film.

Solution to Problem

The present invention provides:
1) a titanium target for sputtering, wherein the Shore hardness Hs is 20 or more and the basal plane orientation ratio is 70% or less.

The present invention also provides:
2) the titanium target for sputtering according to 1) above, wherein the titanium has a purity of 99.995 mass % or more, excluding gas components;
3) the titanium target for sputtering according to 1) above, wherein the Shore hardness Hs is 25 or more; and
4) the titanium target for sputtering according to any one of 1) to 3) above, wherein the basal plane orientation ratio is 55% or less.

The present invention further provides:
5) the titanium target for sputtering according to any one of 1) to 4) above, wherein the 0.2% proof stress in a tensile test at room temperature (23° C.) is 330 N/mm$^2$ or more; and
6) the titanium target for sputtering according to any one of 1) to 5) above, wherein the 0.2% proof stress in a tensile test at 500° C. is 36 N/mm$^2$ or more.

The titanium target for sputtering has beneficial effects of: inhibiting occurrence of particles and an abnormal discharge phenomenon by reducing impurities contained in the target; preventing occurrence of cracking or breaking even in high-power sputtering (high-rate sputtering); stabilizing sputtering characteristics; and allowing formation of a high-quality film.

DETAILED DESCRIPTION

Figure 1:
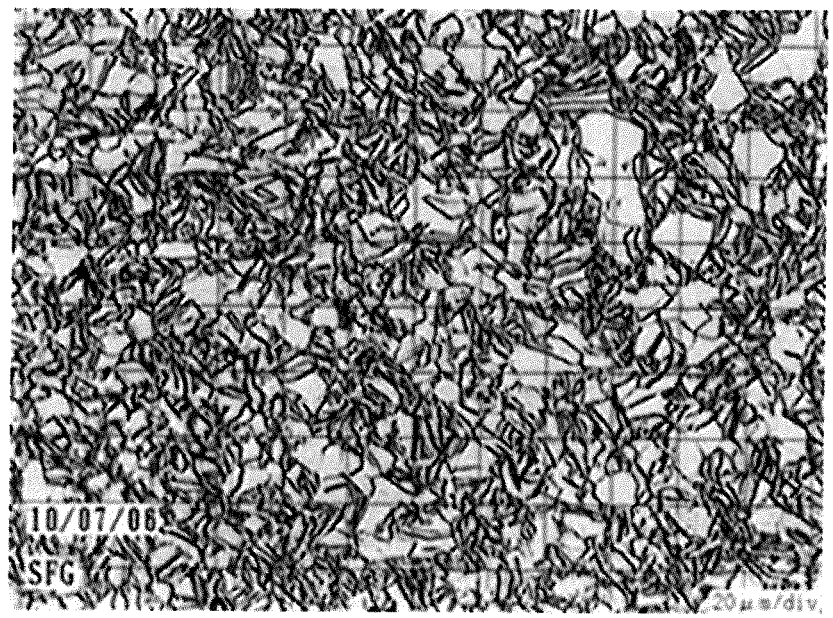
FIG. 1 This is an SEM photograph of a sputtered surface of a titanium target for sputtering of the present invention.

The titanium target for sputtering according to the present invention has a Shore hardness Hs of 20 or more and a basal plane orientation ratio of 70% or less.

If the Shore hardness Hs is less than 20, the strength of the titanium target is insufficient, breaking and cracking occur, in particular, in high-power sputtering (high-rate sputtering), and abnormal discharge and occurrence of particles are induced. The Shore hardness Hs is preferably 25 or more, and the present invention can achieve such a Shore hardness.

In addition, the titanium target for sputtering according to the present invention has a basal plane orientation ratio of 70% or less. The basal plane is a plane having plane index (002), (103), (104), or (105).

In general, cold working of the sputtering surface of a target induces strain, and the hardness increases. The basal plane orientation ratio of Ti tends to decrease by the introduction of strain. That is, there is a certain correlation between introduction of strain and orientation to some extent, and the basal plane orientation ratio decreases thereby. This is a preferred phenomenon.

As described below, the heat during sputtering also affects crystalline plane orientation to change it. Even in the basal plane of Ti, when the orientation ratio of a specific plane exceeds 70%, the degree of a change caused by the heat during sputtering becomes large to affect the film-forming rate and the film quality. Accordingly, the basal plane orientation ratio is preferably 70% or less, and more preferably 55% or less.

Furthermore, the present invention provides a titanium target for sputtering wherein the purity of titanium is 99.995 mass % or more, excluding gas components. In general, gas components such as oxygen, nitrogen, and hydrogen are contained in higher amounts than those of other impurity elements. Though a less content of these gas components is preferred, an amount of gas components at ordinarily-incorporated level does not become harmful for achieving the object of the present invention. The present invention also can provide a titanium target for sputtering, wherein the purity of titanium is 99.995 mass % or more, excluding gas components.

In sputtering, the outermost surface of a target is heated to about 700° C., and the vicinity of the surface is heated to about 500° C. The titanium target of the present invention can prevent breaking and cracking even if it is exposed to high temperature. Breaking and cracking of a target are mainly caused by warping during sputtering or low cycle fatigue fracture resulting from cyclic deformation due to the ON/OFF operation for sputtering power application. Accordingly, a titanium target for sputtering not causing breaking and cracking can be provided by increasing the strength (0.2% proof stress) of the target material.

In particular, in order to prevent breaking and cracking of a target in high-power sputtering in which the target is exposed to high temperature, it is desirable that the 0.2% proof stress in a tensile test at 500° C. be 36 N/mm$^2$ or more. A 0.2% proof stress of 36 N/mm$^2$ or more in a tensile test at 500° C. can be achieved by adding impurity elements of Al, Si, S, Cl, Cr, Fe, Ni, As, Zr, Sn, Sb, B, and La in a total amount of 50 mass ppm or less to the target while the purity of titanium being maintained to 99.995 mass % or more, excluding gas components.

In addition, the heat during sputtering also affects crystalline plane orientation. A change in crystalline plane orientation affects the film-forming rate and the film quality and is not preferred. The aforementioned crystalline orientation of the present invention, however, is not biased to specific crystalline orientation and can reduce a change in crystalline plane orientation and thereby has an effect of maintaining a constant level of film formation quality.

The above-described effects can be achieved under the conditions that a titanium target itself has a high purity, a Shore hardness Hs of 20 or more, a basal plane orientation ratio of 70% or less, a 0.2% proof stress of 330 N/mm$^2$ or more in a tensile test at room temperature (23° C.), and a 0.2% proof stress of 36 N/mm$^2$ or more in a tensile test at 500° C. These numerical ranges show the ranges in which effectiveness of the present invention can be realized.

In a range lower than the lower limit, the object of the present invention cannot be achieved, and values outside the limitation impair the characteristics as a high-purity target. The numerical values are therefore regulated within the aforementioned ranges.

The high-purity titanium can be produced by well-known fused salt electrolysis. The atmosphere is desirably an inert atmosphere. The initial cathode current density during electrolysis is desirably a low current density of 0.6 A/cm$^2$ or less. The electrolysis temperature is preferably 600 to 800° C.

The electrodeposited Ti obtained thereby is subject to EB (electron beam) melting and is then solidified by cooling into an ingot, and this is subject to hot forging at 800 to 950° C. or hot plastic forming such as hot extrusion to prepare a billet. Such processing can destroy the ununiform and coarse cast structure of the ingot to achieve uniformity and refinement.

The billet is cut into preforms each having a volume corresponding to that of a target. This preform is provided with high strain by cold forging or cold plastic forming such as cold rolling and is formed into a disk-shaped target material, for example.

Furthermore, the target material having a processed structure storing high strain is rapidly heated using, for example, a fluidized bed furnace and is subject to heat treatment at 400 to 500° C. for a short time. A target material having a fine recrystallized structure of 20 μm or less is obtained thereby. Conventionally, the processing is completed by this process step. In the present invention, however, the target material is further subject to cold working (usually, reduction of 10 to 30%), followed by finishing such as polishing to yield a titanium target. That is, the present invention is basically a cold-worked material.

The above-described process is an example of the method of preparing a titanium target of the present invention, and the method of preparing the titanium target of the present invention is not limited thereto as long as the resulting titanium target has a Shore hardness Hs of 20 or more, a basal plane orientation ratio of 70% or less, a 0.2% proof stress of 330 N/mm² or more in a tensile test at room temperature (23° C.), and a 0.2% proof stress of 36 N/mm² or more in a tensile test at 500° C.

EXAMPLES

Examples of the present invention will be described below. The following Examples are merely examples, and the present invention is not limited thereto. In other words, the present invention includes all other modes and modifications other than these Examples within the scope of the technical idea of the invention.

Examples 1 to 3

High-purity titanium having a purity of 99.995 mass % produced based on the aforementioned production process was subject to electron beam melting and was processed into Ti ingots of these three Examples by appropriately applying the production conditions shown in above paragraphs [0023] to [0026]. The ingots were processed into a target shape.

Table 1 shows the Shore hardness values measured at any three points on the surface of the each target and the average value thereof. Table 2 shows the basal plane orientation ratios measured by XRD.

Examples 4 to 6

The elements: that is, Al of 1.6 mass ppm (hereinafter, "mass" is omitted); Si of 0.2 ppm; S of 4.3 ppm; Cl of 0 ppm; Cr of 0.3 ppm; Fe of 0.6 ppm; Ni of 0 ppm; As of 0 ppm; Zr of 0.1 ppm; Sn of 0.1 ppm; Sb of 0 ppm; B of 0 ppm; and La of 0 ppm, were added, in the total amount of 7.2 mass ppm, to high-purity titanium having a purity of 99.995 mass % or more, which was produced based on the production process described above. The resulting high-purity titanium maintaining a purity of 99.995 mass % as a whole (hereinafter, referred to as trace impurities-added titanium) was subject to electron beam melting and then was processed into Ti ingots of these three Examples by appropriately applying the production conditions shown in paragraphs [0023] to [0026]. The ingots were processed into a target shape.

Table 1 shows the Shore hardness values measured at any three points on the surface of the each target and the average value thereof. Table 2 shows the basal plane orientation ratios measured by XRD.

Comparative Examples 1 to 3

Ti ingots having a purity of 99.995 mass %, which were produced based on the production conditions shown in the above paragraphs [0023] to [0026], were processed into titanium targets (diameter: 300 mm) of these three Comparative Examples without finally being subject to rolling (material that was finished with heat treatment). Table 1 shows the Shore hardness values of the titanium targets measured at any three points on the surface of the each target and the average value thereof. Table 2 shows the basal plane orientation ratios measured by XRD.

TABLE 1

| | | Shore Hardness | | | |
|---|---|---|---|---|---|
| | | Measurement point 1 | Measurement point 2 | Measurement point 3 | Average (Hs) |
| Examples | Example 1 | 29.6 | 28.9 | 28.2 | 28.9 |
| | Example 2 | 27.2 | 26.9 | 27 | 27.0 |
| | Example 3 | 28.3 | 27 | 26.3 | 27.2 |
| | Example 4 | 30.2 | 29.1 | 29.3 | 29.5 |
| | Example 5 | 30.8 | 29.8 | 29.8 | 30.1 |
| | Example 6 | 27.7 | 28.9 | 29.7 | 28.8 |
| Comparative Examples | Comparative Example 1 | 18.3 | 17.5 | 18.3 | 18.0 |
| | Comparative Example 2 | 19.1 | 18.9 | 18.7 | 18.9 |
| | Comparative Example 3 | 19.7 | 20.3 | 19.1 | 19.7 |

TABLE 2

| | | Basal plane orientation ratio (%) |
|---|---|---|
| Examples | Example 1 | 47.3 |
| | Example 2 | 46.0 |
| | Example 3 | 51.4 |
| | Example 4 | 55.5 |
| | Example 5 | 60.7 |
| | Example 6 | 53.6 |
| Comparative Example | Comparative Example 1 | 72.2 |
| | Comparative Example 2 | 75.1 |
| | Comparative Example 3 | 74.8 |

Shore hardness values and basal plane orientation ratios of targets in Examples 1 to 6

As shown in Table 1, in Examples 1 to 6, the following average Shore hardness Hs values were obtained respectively. In addition, as shown in Table 2, the following basal plane orientation ratios were obtained.

Example 1: Cold working rate of 10% after heat treatment; Hs of 28.9; basal plane orientation ratio of 47.3%

Example 2: Cold working rate of 20% after heat treatment; Hs of 27.0; basal plane orientation ratio of 46.0%

Example 3: Cold working rate of 30% after heat treatment; Hs of 27.2; basal plane orientation ratio of 51.4%

Example 4: Trace impurities-added titanium+cold working rate of 10% after heat treatment; Hs of 29.5; basal plane orientation ratio of 55.5%

Example 5: Trace impurities-added titanium+cold working rate of 20% after heat treatment; Hs of 30.1; basal plane orientation ratio of 60.7%

Example 6: Trace impurities-added titanium+cold working rate of 30% after heat treatment; Hs of 28.8; basal plane orientation ratio of 53.6%

Figure 2:
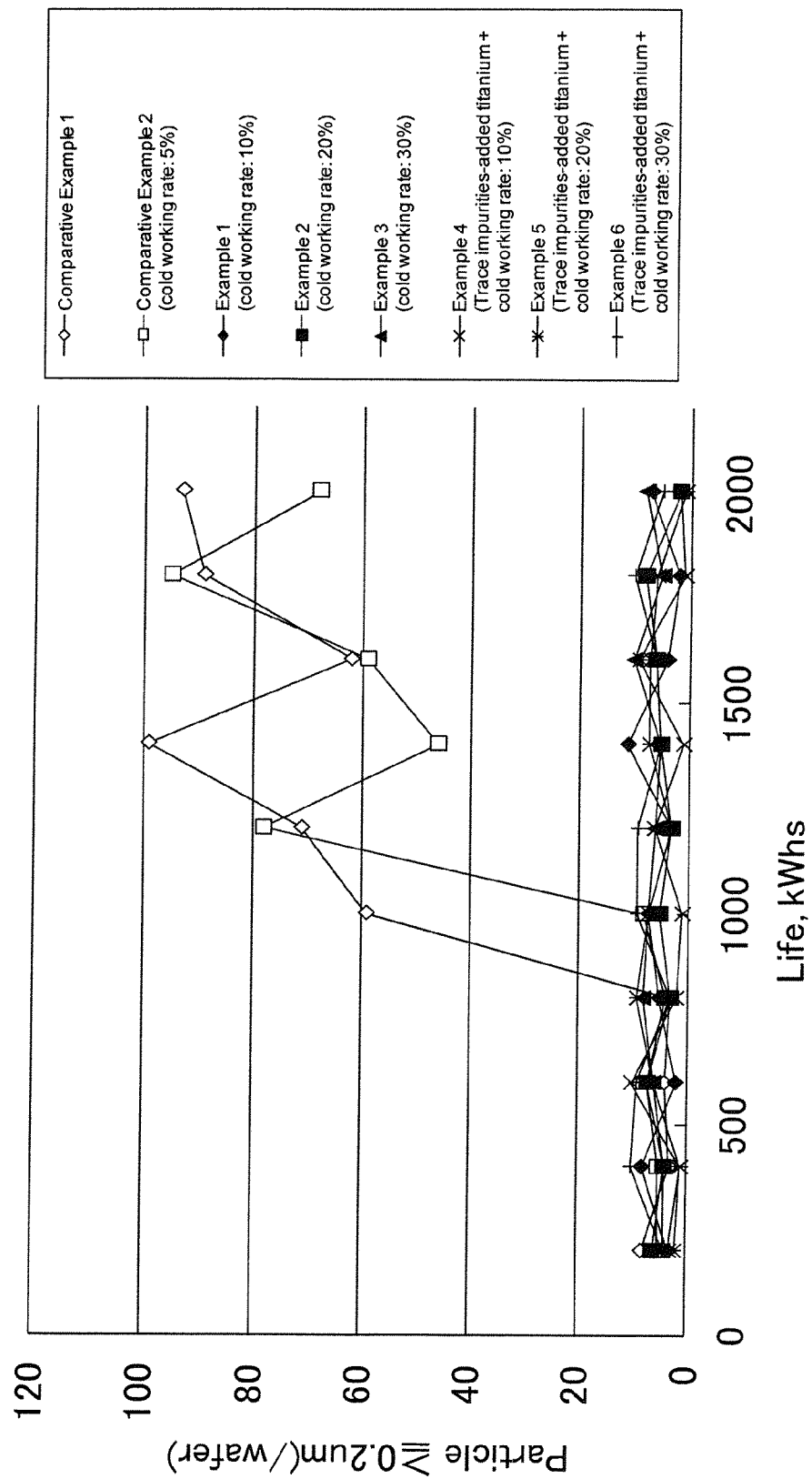
FIG. 2 This is a graph showing the observation results of occurrence of particles when sputtering with each target in Examples 1 to 6 and Comparative Examples 1 and 2.

Each of the targets prepared in Examples 1 to 6 and Comparative Examples 1 to 2 was sputtered with a machine as an actual product, and the occurrence of particles was observed. The numbers of the occurred particles are shown in Table 3. FIG. 2 is a graph of the results shown in Table 3. Here, particles of 0.2 μm or more were counted.

In Examples 1 to 6, though occurrence of particles slightly increased from the initial stage of sputtering to an integral power consumption of 400 kWh, the occurrence of particles was suppressed to be low, and which was maintained to be about the same state. That is, in Examples 1 to 6, occurrence of particles was effectively suppressed.

(Shore Hardness Values and Basal Plane Orientation Ratios of Targets in Comparative Examples 1 to 3)

Comparative Example 1: No cold working after heat treatment; Hs of 18.0; basal plane orientation ratio of 72.2%.

Comparative Example 2: Cold working rate of 5% after heat treatment; Hs of 18.9; basal plane orientation ratio of 65.1%.

Comparative Example 3: Cold working rate of 40% after heat treatment, where processing was incomplete due to severe warping during processing and a target could not be produced therefore.

In Comparative Examples 1 to 2, the occurrence of particles was similarly observed. The results are shown in Table 3 and FIG. 2. As mentioned above, since any target could not be produced in Comparative Example 3, Table 3 and FIG. 2 do not include the results thereof.

As shown in Table 3 and FIG. 2, though occurrence of particles was suppressed to be relatively low from the initial stage of sputtering to an integral power consumption of 800 kWh, sudden occurrence of particles was observed at several points. Then, the occurrence of particles sharply increased till 2000 kWh, and the sputtering became unstable.

TABLE 4

| | | 0.2% Proof stress | |
|---|---|---|---|
| | | Room temperature N/mm² | 500° C. N/mm² |
| Example 1 | cold working rate after heat treatment: 10% | 352 | 18 |
| Example 2 | cold working rate after heat treatment: 20% | 331 | 16 |
| Example 3 | cold working rate after heat treatment: 30% | 340 | 17 |
| Example 4 | trace impurities-added titanium + cold working rate after heat treatment: 10% | 370 | 37 |
| Example 5 | trace impurities-added titanium + cold working rate after heat treatment: 20% | 382 | 40 |
| Example 6 | trace impurities-added titanium + cold working rate after heat treatment: 30% | 365 | 38 |
| Comparative Example 1 | no cold working after heat treatment | 134 | 18 |
| Comparative Example 2 | cold working rate after heat treatment: 5% | 165 | 16 |
| Comparative Example 3 | cold working rate after heat treatment: 40% | Unable to process | |

The conditions of the high-temperature tensile test are as follows:

Test piece shape: JIS Shape (G 056711-6)
Test process: conformity to JIS G 0567
Test machine: 100 kN high-temperature tensile test machine
Test conditions: room temperature (23° C.) and 500° C.
Gauge length: 30 mm
Test rate: displacement control at 0.3%/min, and 7.5%/min after proof stress
Temperature-rising rate: 45° C./min, holding for 15 min

TABLE 3

| Life (kWhs) | Comparative Example 1 | Comparative Example 2 (cold working rate: 5%) | Example 1 (cold working rate: 10%) | Example 2 (cold working rate: 20%) | Example 3 (cold working rate: 30%) | Example 4 (Trace impurities-added titanium + cold working rate: 10%) | Example 5 (Trace impurities-added titanium + cold working rate: 20%) | Example 6 (Trace impurities-added titanium + cold working rate: 30%) |
|---|---|---|---|---|---|---|---|---|
| 0 | | | | | | | | |
| 200 | 8 | 5 | 3 | 6 | 4 | 3 | 2 | 4 |
| 400 | 3 | 5 | 8 | 4 | 4 | 1 | 1 | 10 |
| 600 | 4 | 7 | 2 | 7 | 6 | 10 | 6 | 9 |
| 800 | 3 | 4 | 5 | 3 | 8 | 2 | 9 | 3 |
| 1000 | 59 | 8 | 7 | 5 | 7 | 1 | 7 | 9 |
| 1200 | 71 | 78 | 3 | 3 | 6 | 6 | 3 | 9 |
| 1400 | 99 | 46 | 11 | 5 | 5 | 1 | 7 | 5 |
| 1600 | 62 | 59 | 4 | 6 | 10 | 9 | 7 | 6 |
| 1800 | 89 | 95 | 2 | 8 | 5 | 1 | 6 | 10 |
| 2000 | 93 | 68 | 7 | 2 | 8 | 2 | 1 | 5 |

Table 4 shows 0.2% proof stress values in a tensile test in Examples 1 to 6 and Comparative Examples 1 to 3. The respective tensile test pieces were produced so that the radial direction of a circular target would become the longitudinal direction.

The test pieces were sampled from three positions, i.e., the center, ½R, and the outer periphery, of each of the circular sputtering targets produced in Examples and Comparative Examples, and the average of 0.2% proof stress values at three positions was used as the 0.2% proof stress in each Example or Comparative Example.

Temperature measurement: the center of a test piece is fixed to thermocouple

In Examples 1 to 6 where appropriate degrees of cold working were performed, the 0.2% proof stress at room temperature was notably increased in comparison to those in Comparative Examples. Furthermore, in Examples 4 to 6 using trace impurities-added titanium, the 0.2% proof stress at room temperature was further increased even in comparison with those in Examples 1 to 3, and the 0.2% proof stress at 500° C. has doubled in comparison to those in Comparative Examples 1 and 2 and Examples 1 to 3. Thus, as to these titanium targets, the cracking resistance in high-power sputtering, in which a target is exposed to high temperature, was further improved.

It is possible to provide a high-quality titanium target for sputtering, in which impurities causing occurrence of particles and an abnormal discharge phenomenon are reduced, and which can prevent occurrence of cracking or breaking even in high-power sputtering (high-rate sputtering), stabilize sputtering characteristics, and effectively suppress occurrence of particles during formation of a film. Accordingly, the present invention is useful for forming thin films for, for example, electronic instruments.

The invention claimed is:

1. A titanium target for sputtering having a Shore hardness Hs of 20 or more, a basal plane orientation ratio of 70% or less, and a 0.2% proof stress in a tensile test at room temperature (23° C.) of 330 N/mm² or more.

2. The titanium target for sputtering according to claim 1, having a purity of 99.995 mass % or more, excluding gas components.

3. The titanium target for sputtering according to claim 1, wherein the Shore hardness Hs is 25 or more.

4. The titanium target for sputtering according to claim 1, wherein the basal plane orientation ratio is 55% or less.

5. A titanium target for sputtering having a Shore hardness Hs of 25 or more and a basal plane orientation ratio of 70% or less.

6. The titanium target for sputtering according to claim 5, wherein the basal plane orientation ratio is 55% or less.

7. The titanium target for sputtering according to claim 5, wherein the titanium target has a 0.2% proof stress in a tensile test at room temperature (23° C.) of 330 N/mm² or more.

8. The titanium target for sputtering according to claim 5 having a purity of 99.995 mass % or more, excluding gas components.

9. A titanium target for sputtering, having a Shore hardness Hs of 20 or more, a basal plane orientation ratio of 70% or less, and a 0.2% proof stress in a tensile test at 500° C. of 36 N/mm² or more.

10. The titanium target for sputtering according to claim 9, wherein the Shore hardness Hs is 25 or more.

11. The titanium target for sputtering according to claim 9 having a purity of 99.995 mass % or more, excluding gas components.

12. The titanium target for sputtering according to claim 9, wherein the basal plane orientation ratio is 55% or less.

13. The titanium target for sputtering according to claim 9, wherein the 0.2% proof stress in a tensile test at room temperature (23° C.) is 330 N/mm² or more.

* * * * *